US006884711B2

(12) United States Patent
Vonstaudt

(10) Patent No.: US 6,884,711 B2
(45) Date of Patent: Apr. 26, 2005

(54) PARTIALLY POPULATED BALL GRID DESIGN TO ACCOMMODATE LANDING PADS CLOSE TO THE DIE

(75) Inventor: Hans Martin Vonstaudt, Weilheim (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 34 days.

(21) Appl. No.: 10/336,995

(22) Filed: Jan. 6, 2003

(65) Prior Publication Data

US 2004/0113252 A1 Jun. 17, 2004

(30) Foreign Application Priority Data

Dec. 17, 2002 (EP) ............................................. 02368133

(51) Int. Cl.[7] ............................................. H01L 21/44
(52) U.S. Cl. ........................ 438/617; 438/614; 438/612; 438/599
(58) Field of Search ................................ 438/599, 612, 438/614, 617, 618; 257/773, 776, 781, 782; 361/773, 760, 772, 776, 779, 783

(56) References Cited

U.S. PATENT DOCUMENTS

| 5,465,217 | A |   | 11/1995 | Yip et al. ..................... 364/489 |
| 5,490,040 | A | * | 2/1996 | Gaudenzi et al. ............ 361/773 |
| 5,650,660 | A |   | 7/1997 | Barrow ......................... 257/668 |
| 5,753,970 | A | * | 5/1998 | Rostoker ...................... 257/668 |
| 5,798,571 | A | * | 8/1998 | Nakajima ..................... 257/784 |
| 6,097,098 | A | * | 8/2000 | Ball .............................. 257/786 |
| 6,107,685 | A | * | 8/2000 | Nishiyama ................... 257/737 |
| 6,160,313 | A |   | 12/2000 | Takashima et al. .......... 257/737 |
| 6,269,327 | B1 |   | 7/2001 | Bednar et al. .................. 703/8 |
| 6,483,190 | B1 | * | 11/2002 | Kainuma et al. ............ 257/737 |
| 2002/0190362 | A1 | * | 12/2002 | Khan et al. .................. 257/678 |
| 2003/0110624 | A1 | * | 6/2003 | Rumsey et al. ................ 29/840 |

FOREIGN PATENT DOCUMENTS

EP 1075026 A2 4/2000 ......... H01L/23/498

* cited by examiner

*Primary Examiner*—Chandra Chaudhari
*Assistant Examiner*—William Vesperman
(74) *Attorney, Agent, or Firm*—George O. Saile; Stephen B. Ackerman

(57) ABSTRACT

Methods and structures to reduce in semiconductor packages the length of critical electrical connections between bond pads on one or multiple semiconductor chips and wire landing pads on a substrate have been achieved. An electrical connection becomes critical if high current, high speed or radio frequency signals have to be transported. Moving the wire landing pads of critical connections on the substrate closer to the semiconductor chip utilizing unpopulated spaces of an array grid design reduces the length of said wires. This could be a ball grid array (BGA) or any other kind of grid array. Said methods and structures invented are applicable to single-chip modules and to multi-chip modules. The design of the grid array has to be modified to provide free spaces for the wire landing pads of critical electrical connections within the grid array close to the semiconductor chip as required by the design rules. The design change can be done without increasing the number of solder balls or solder pins, etc. and without increasing the area required on the motherboard.

24 Claims, 4 Drawing Sheets

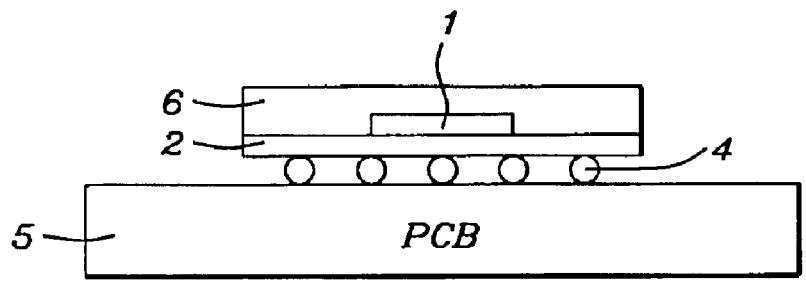
FIG. 1 - Prior Art
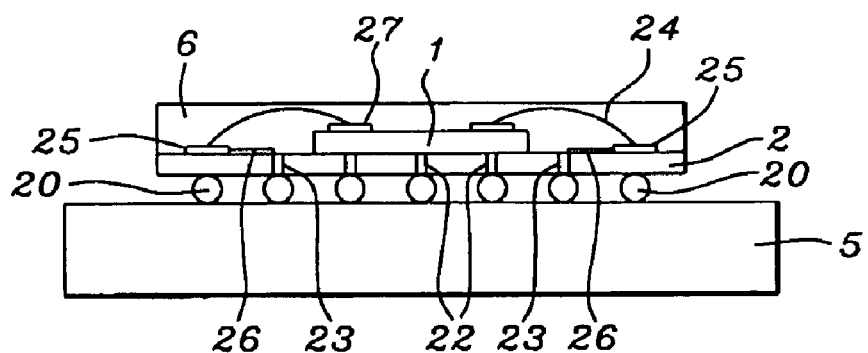
FIG. 2 - Prior Art

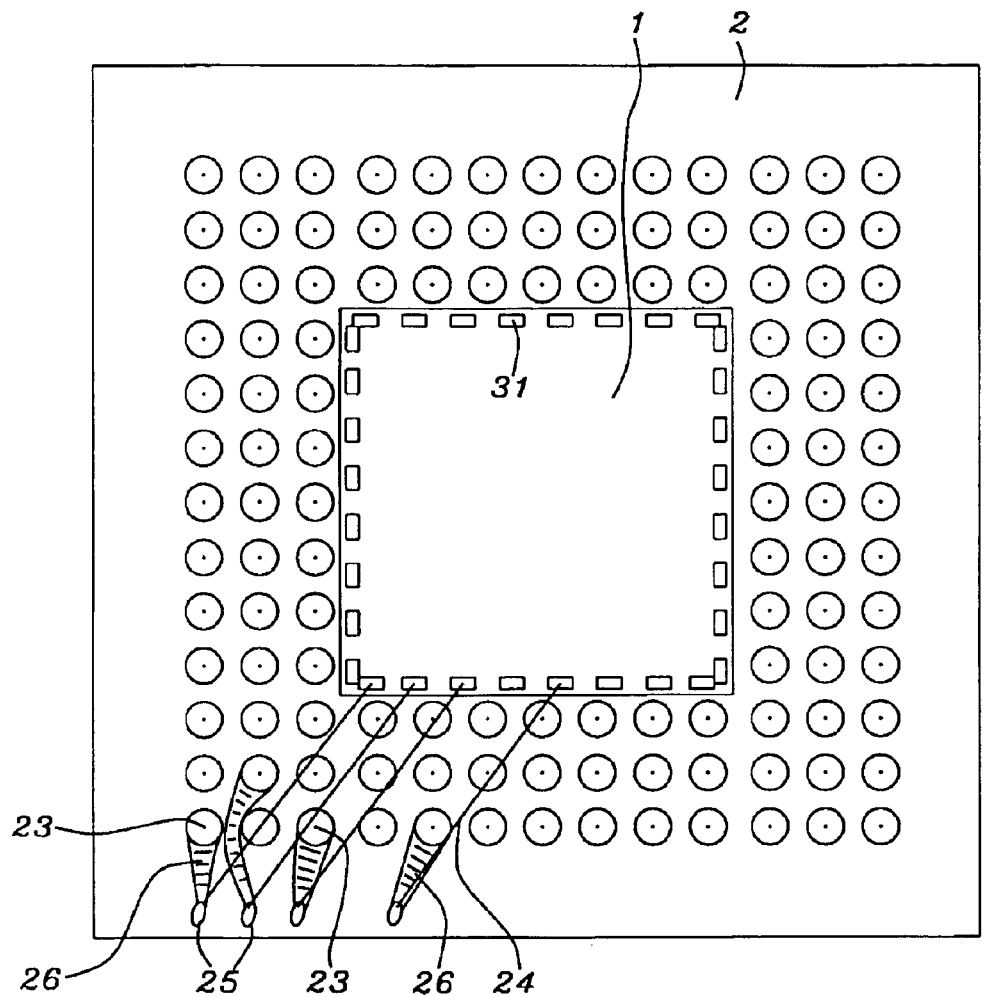
FIG. 3 — Prior Art

PARTIALLY POPULATED BALL GRID DESIGN TO ACCOMMODATE LANDING PADS CLOSE TO THE DIE

BACKGROUND OF THE INVENTION (1) Field of the Invention

This invention relates generally to semiconductor packages, and more particular, to electrical connections between semiconductor dies and the related substrate as part of the package.

(2) Description of the Prior Art

The present miniaturization trend in electronics towards higher-performance, smaller and lighter products has resulted in an increasing demand for smaller component packages and/or higher pin counts. The Ball Grid Array (BGA) concept has received much appreciation owing to its inherent, potential benefits to surface mount production. The BGA, taking advantage of the area under the package for the solder sphere interconnections, accommodates the increasing number of I/Os needed.

FIG. 1 prior art shows how a BGA package is composed of a chip 1, a BGA substrate 2, an interconnection 4 between said substrate 2 to a Printed Circuit Board (PCB) or motherboard 5 and a cover 6 to seal said package. Depending on the package style, the bare chip may be affixed to the BGA substrate 2 either face-up or facedown. The BGA substrate 2, which is really a miniature multi-layer Printed Circuit Board (PCB) with fine traces and microscopic through-hole vias, conveys the signals to the underlying printed circuit board 5 through an array of solder-bump attachments pads 4 on its bottom surface.

A cross-section of a typical prior art BGA is shown in FIG. 2 prior art, depicting a semiconductor chip 1, attached and wire-bonded to a BGA substrate 2. Wires 24 provide the connections between bond pads 27 on the semiconductor die 1 and wire landing pads or bond fingers 25 on the substrate 2. Leads as part of the bonding pattern 26 are provided to connect said wire-landing pads 25 to a through-hole via 23. Solder balls 20 are attached to the other side of the substrate 2 electrically connecting the circuitry of the BGA integrated circuit package to external circuitry on a printed circuit motherboard 5. A cover 6 is protecting said BGA. For lower pin counts, most often a two-sided substrate metallization is sufficient to provide electrical contact from wire-bonds through the plated through-holes to solder ball pads. In addition, thermal balls under the center of the package are often used to remove heat from the device through thermal vias 22.

FIG. 3 prior art shows a top view of another typical prior art implementation. A semiconductor chip 1 is attached to a substrate 2. In said prior art implementation solder balls are attached on the bottom of the substrate. They are connected by through-hole vias 23 and by leads 26 on the top surface of said substrate with the wire landing pads 25 on the top surface of said substrate 2. In order to avoid unnecessary complexity in FIG. 3 prior art only a few wire-landing pads are shown. Said through-hole vias 23 are located, as shown in FIG. 2 prior art, directly on top of said solder balls although this is not necessarily the case for all BGA technologies; if there are leads on the bottom side of the substrate the through-hole vias may be placed in a certain distance to the ball but this is not shown to avoid unnecessary complexity. Said wire landing pads 25 are located on the periphery of the substrate 2, outside of the ball grid, therefore requiring a significant length of all the bond wires 24 establishing the electrical connections between bond pads 31 on a chip 1 and said wire landing pads 25 on substrate 2. On the side of the chip 1 said wires are fastened on said bond pads 31. Said wires 24 have a significant length because all wire landing pads 25 on the substrate are located outside the ball grid array. A set of leads 26 are connecting said wire-landing pads 25 with said through-hole vias 23 as shown in FIG. 2 prior art. The length of said bond wires 24 is causing problems in the transmission of critical signals as e.g. high current signals, high-speed signals or high frequency signals.

With the general trend of miniaturization the length of said wires between the semiconductor chip and the substrate is causing more and more problems to the designers, especially for high current signals. The miniaturized spacing does not allow for wire landing pads in the via/ball array. Wire landing pads cannot be sized accordingly as the wire diameter shall not be reduced. Wires transporting high current signals must not exceed a critical wire length. There are prior art solutions having, as described, the wire landing pads of the bond wires outside the ball grid. This causes problems with wires being too long. Other solutions are having the landing pads inside the ball grid array close to the die. The disadvantage of this solution is that the grid array has been moved more far away from the semiconductor die and the package is consuming additional space on the motherboard and hence is too expensive. With the progress of miniaturization of semiconductor chips it is a growing challenge for the designers of electronic circuits to find a solution having short wires consuming minimal space on the motherboard.

U.S. Pat. No. (5,741,726 to Barber) describes a semiconductor device having external connections, including power supply connections such as to a power source or ground, is made without resort to wire landing pads. Rather, external connections are directly made from a semiconductor die to a conductive layer. The conductive layer is disposed on one surface of a printed wiring board and is divided into electrically insulated conductive segments. Each of the segments is connected to an external connection, and includes one or more interconnects that can be directly connected to a semiconductor die. The conductive segments are surrounded by an array of wire landing pads, which serve to connect the semiconductor die to further external connections, such as signal connections.

U.S. Pat. No. (6,323,065 to Karnezos) discloses a semiconductor package arrangement including a heat spreader for dissipating heat and a ground plane having a first side that is attached to the heat spreader. The ground plane has a first aperture defining a path to a surface of the heat spreader that is configured to receive a semiconductor die. An interconnect substrate is attached to the ground plane, and the interconnect substrate has a complimentary second aperture over the first aperture of the ground plane. Preferably, the interconnect substrate has a plurality of metal patterns for electrically interconnecting the semiconductor die to electrical connections that are external to the semiconductor arrangement. The package arrangement further includes at least one conductively filled via that is defined through the interconnect substrate and is in electrical contact with the ground plane to establish a direct ground connection from selected ones of the plurality of metal patterns of the interconnect substrate.

U.S. Pat. No. (6,389,689 to Heo) describes a method of fabricating a small-size multi-pin semiconductor package, which is as large as the semiconductor chip mounted thereon. Bond pads formed on semiconductor chip may be arranged at the center or at the edges of the upper surface of said semiconductor chip. A signal output from semiconductor chip is transmitted to a circuit pattern through a wire and then supplied to a motherboard through a solder ball.

SUMMARY OF THE INVENTION

A principal object of the present invention is to define a method and a structure to reduce the length of critical electrical connections, e.g. carrying high current signals, high speed signals or radio frequency signals, of a semiconductor package between a semiconductor chip and the related landing pads of said wires on a package substrate without increasing the space required for the semiconductor package.

In accordance with the objects of the invention a method to reduce the length of critical electrical connections of a semiconductor package between bond pads on a semiconductor chip and landing pads on a single-chip substrate has been achieved. Said method is comprising, first, providing a semiconductor chip, a grid array semiconductor package substrate, electrical connections from said semiconductor substrate to external circuitry performed in a grid array and electrical connections between said chip and said substrate. The steps of said method comprise further to identify critical wires requiring landing pads within said grid array due to bond wire-length limitations, then to identify non-critical wires which can have landing pads outside said grid array, to design a grid array creating empty locations within said array as required and identified in the previous steps for landing pads of critical wires, and to design the leads from the landing pads of said critical wires to the next suitable via hole.

In accordance with the objects of this invention a method to reduce the length of critical electrical connections of a semiconductor package between bond pads on semiconductor chips and landing pads on a multi-chip substrate has been achieved. Said method is comprising, first, providing more than one semiconductor chip, a grid array semiconductor package substrate, electrical connections from said semiconductor substrate to external circuitry performed in a grid array and electrical connections between said chip and said substrate. The steps of said method comprise further to identify critical wires requiring landing pads within said grid array due to bond wire-length limitations, to identify non-critical wires which can have landing pads outside said grid array, to design a grid array creating empty locations within said grid array as required and identified in the previous steps for landing pads of critical wires, and to design the leads from the landing pads of said critical wires to the next suitable via hole.

In accordance with the objects of this invention a structure to reduce the length of critical electrical connections of a semiconductor package between a semiconductor chip and a single-chip substrate has been achieved. Said structure comprises a semiconductor chip having bonding pads for electrical connections to landing pads on a substrate where said chip is mounted on, a means of electrical connections between said semiconductor chip and said substrate wherein landing pads on said substrate are provided for said electrical connections, and a substrate said semiconductor chip is mounted on being electrically connected to said chip and to an external circuitry wherein said electrical connections to an external circuit are performed by a grid array arrangement and wherein said landing pads for connections requiring very a limited length are located within said grid array.

In accordance with the objects of this invention a structure to reduce the length of critical electrical connections of a semiconductor package between semiconductor chips and a multi-chip substrate has been achieved. Said structure is comprising more than one semiconductor chip all having landing pads for electrical connections to a substrate where said chips are mounted on, a means of electrical connections between said semiconductor chips and said substrate wherein landing pads on said substrate are provided for said electrical connection, and a substrate said semiconductor chips are mounted on being electrically connected to said chips and to an external circuitry wherein said electrical connections to an external circuit are performed by an grid array arrangement and wherein said landing pads for connections requiring very a limited length are located within said grid array.

BRIEF DESCRIPTION OF THE DRAWINGS

In the accompanying drawings forming a material part of this description, there is shown:

FIG. 1 prior art illustrates the main components of a ball grid array (BGA) package.

FIG. 2 prior art shows a cross section of a BGA package.

FIG. 3 prior art shows a top view of a BGA package.

DESCRIPTION OF THE PREFERRED EMBODIMENTS

The preferred embodiments disclose a method and a structure capable to reduce the wire-lengths of the wires providing the connections of a semiconductor package from a chip to a substrate without increasing the space required on a motherboard.

Figure 4:
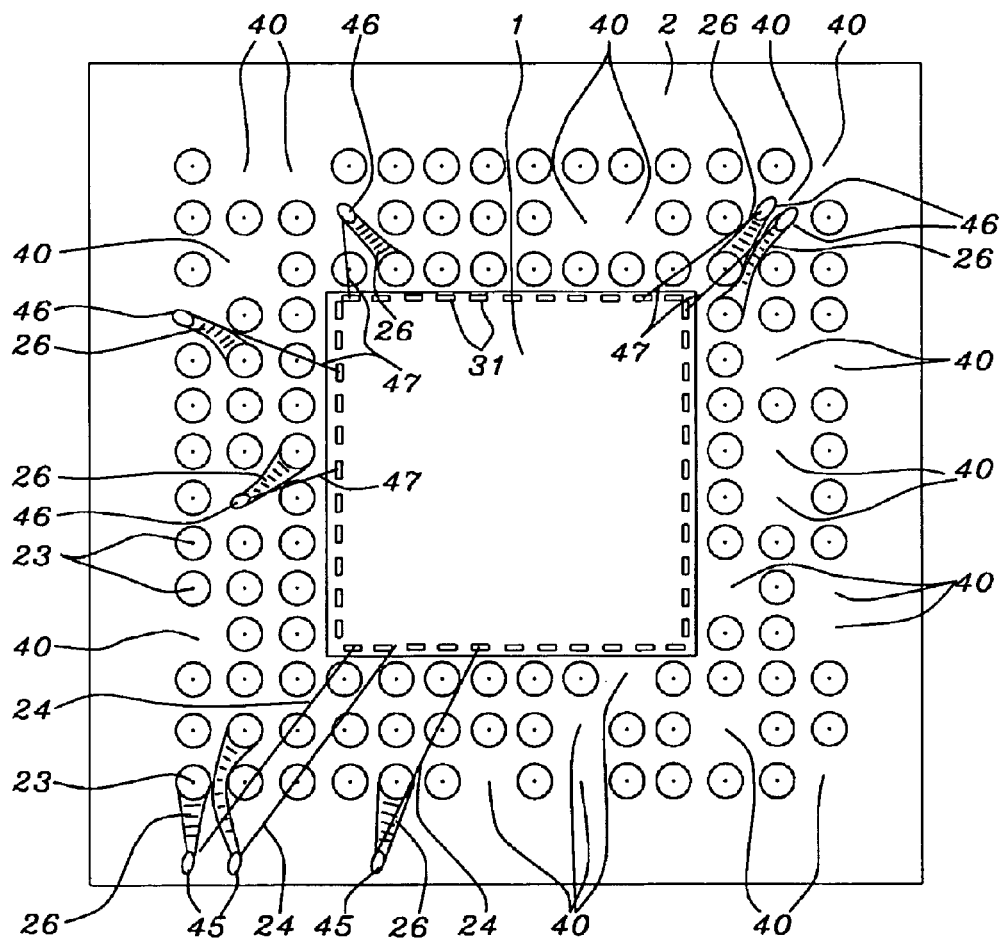
FIG. 4 shows a top view of a principal layout of a grid array substrate invented.

The BGA design principles allow any number of solder balls or rows of solder balls. FIG. 4 shows a principal layout of a new structure of the present invention. Similar to FIG. 3 prior art, FIG. 4 shows a chip 1 on a substrate 2, leads 26 from wire landing pads to through-hole vias 23 and wires 24 from said landing pads on the substrate 2 to bonding pads 31 on the chip 1. In order to reduce the complexity in FIG. 4 only a few wire-landing pads, related bonding wires, and leads on the substrate are shown. One of the objectives of the invention was not to increase the number of solder balls required and not to increase the size of the area required on the mother-board, thus not increasing the cost of said BGA module. In the design described in FIG. 3 prior art no space is available for landing pads within the grid array and hence the landing pads of the bonding wires from the semiconductor chip 1 have to be located outside of the ball grid array of the substrate 2. FIG. 4 shows that, by changing the design of the grid array, spaces 40 unpopulated by via holes are achieved. There are various ways to do such a design change. One alternative is simply to reduce the number of balls. This is not always possible. Another alternative is to increase the number of ball locations as shown e.g. in FIG. 3 prior art and FIG. 4. For example FIG. 3 prior art shows a 13×13 fully populated grid having 169 balls or ball locations, FIG. 4 shows a 14×14 partially populated grid resulting 196 ball locations or resulting in 27 unpopulated spaces (not all unpopulated spaces are visible in FIG. 4).

FIG. 4 shows also how said unpopulated free spaces 40 can accommodate now, as key part of the invention, wire landing pads 46 of critical electrical connections 47 between said semiconductor chip 1 and the substrate 2. Thus, the length of bond wires 47 carrying critical signals as e.g. high current signals, high-speed signals or high frequency signals is reduced significantly. Bond wires carrying non-critical signals are signified as in FIG. 3 prior art with the number 24, their length remains unchanged. Landing pads 45 for these non-critical wires 24, carrying e.g. lower current signals, are still outside the ball grid array.

Figure 5:
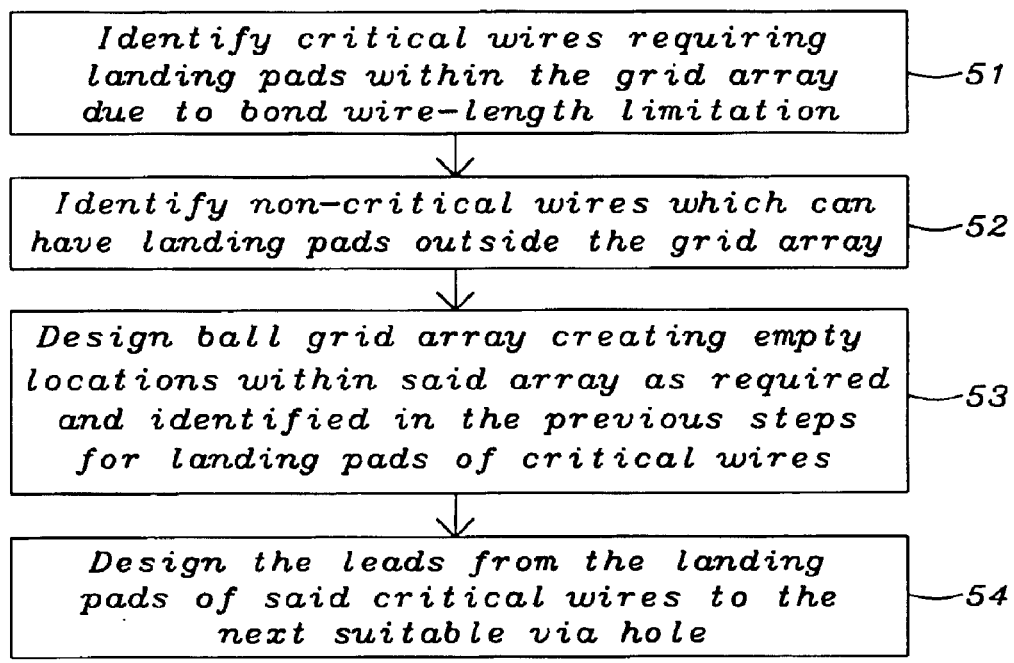
FIG. 5 shows a flowchart of the method invented.

FIG. 5 illustrates a method how to reduce the wire-length of critical wires by moving the landing pads closer to the semiconductor die. In first step 51 the critical wires that require landing pads within the grid array due to bond wire-length limitations are being identified. In the next step 52 non-critical wires that can have landing pads outside the grid array are being identified as well. In the following step 53 the ball grid array is designed in a way to create empty locations within said array as required and identified in the previous steps followed by step 54 wherein the leads from the landing pads of said critical wires to the next suitable via hole are being designed.

It is obvious to those skilled in art that the method and structure invented is applicable to all kind of BGA technologies which prevent landing pads on top of the balls as single sided substrates, double sided substrates or "via-on-ball" substrates. Additionally the invention is applicable to any kind of array packages as e.g. ball grid array, pin grid array, etc. Additionally said method and structure is applicable to single-chip substrates and to multi-chip substrates as well.

While the invention has been particularly shown and described with reference to the preferred embodiments thereof, it will be understood by those skilled in the art that various changes in form and details may be made without departing from the spirit and scope of the invention.

What is claimed is:

1. A method to reduce the length of critical electrical connections of a semiconductor package between bond pads on a semiconductor chip and landing pads on a single-chip substrate, comprising:

providing a semiconductor chip, a grid array semiconductor package substrate, electrical connections from said semiconductor substrate to external circuitry performed in a grid array and electrical connections between said chip and said substrate;

identify critical wires requiring landing pads within said grid array due to bond wire-length limitations;

identify non-critical wires that can have landing pads outside said grid array;

design grid array creating empty locations within said grid array as required and identified in the previous steps for landing pads of critical wires; and design the leads from the landing pads of said critical wires to the next suitable via hole.

2. The method of claim 1 wherein said electrical connections between said chip and landing pads on said substrate are performed by a bonding process.

3. The method of claim 1 wherein said grid array semiconductor package is a ball grid array.

4. The method of claim 1 wherein said grid array semiconductor package is a pin grid array.

5. The method of claim 1 wherein said substrate is a single-sided substrate.

6. The method of claim 1 wherein said substrate is a double-sided substrate.

7. The method of claim 1 wherein said substrate is a "via-on-ball" substrate.

8. The method of claim 1 wherein said electrical connections from said chip to said substrate comprise metal.

9. The method of claim 8 wherein said electrical connections are metal wires.

10. The method of claim 9 wherein said metal wires comprise gold.

11. The method of claim 9 wherein said metal wires comprise copper.

12. The method of claim 9 wherein said metal wires comprise aluminum.

13. A method to reduce the length of critical electrical connections of a semiconductor package between bond pads on semiconductor chips and landing pads on a multi-chip substrate, comprising:

providing more than one semiconductor chip, a grid array semiconductor package substrate, electrical comections from said semiconductor substrate to external circuitry performed in a grid array and electrical connections between said chip and said substrate;

identify critical wires requiring landing pads within said grid array due to bond wire-length limitations;

identify non-critical wires that can have landing pads outside said grid array;

design grid array creating empty locations within said grid array as required and identified in the previous steps for landing pads of critical wires; and design the leads from the landing pads of said critical wires to the next suitable via hole.

14. The method of claim 13 wherein said electrical connections between said chip and landing pads on said substrate are performed by a bonding process.

15. The method of claim 13 wherein said grid array semiconductor package is a ball grid array.

16. The method of claim 13 wherein said grid array semiconductor package is a pin grid array.

17. The method of claim 13 wherein said substrate is a single-sided substrate.

18. The method of claim 13 wherein said substrate is a double-sided substrate.

19. The method of claim 13 wherein said substrate is a "via-on-ball" substrate.

20. The method of claim 13 wherein said electrical connections from said chips to said substrate comprise metal.

21. The method of claim 20 wherein said electrical connections are metal wires.

22. The method of claim 21 wherein said metal wires comprise gold.

23. The method of claim 21 wherein said metal wires comprise copper.

24. The method of claim 21 wherein said metal wires comprise aluminum.

* * * * *